US012376241B2

(12) United States Patent
Baek et al.

(10) Patent No.: US 12,376,241 B2
(45) Date of Patent: Jul. 29, 2025

(54) ELECTRONIC DEVICE HAVING HOUSING COMPRISING METAL MATERIAL

(71) Applicant: SAMSUNG ELECTRONICS CO., LTD., Suwon-si (KR)

(72) Inventors: Sangin Baek, Suwon-si (KR); Daum Hwang, Suwon-si (KR); Yoonhee Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 409 days.

(21) Appl. No.: 18/086,895

(22) Filed: Dec. 22, 2022

(65) Prior Publication Data

US 2023/0121011 A1    Apr. 20, 2023

Related U.S. Application Data

(63) Continuation of application No. PCT/KR2021/007341, filed on Jun. 11, 2021.

(30) Foreign Application Priority Data

Jun. 23, 2020    (KR) .................... 10-2020-0076697

(51) Int. Cl.
*H05K 5/02*    (2006.01)
*G06F 1/16*    (2006.01)
*H04M 1/02*    (2006.01)

(52) U.S. Cl.
CPC ......... *H05K 5/0217* (2013.01); *G06F 1/1626* (2013.01); *G06F 1/163* (2013.01); *G06F 1/1637* (2013.01); *H04M 1/0202* (2013.01)

(58) Field of Classification Search
CPC .......... H05K 5/0217; H05K 5/04; H05K 5/03; G06F 1/1626; G06F 1/163; G06F 1/1637;
(Continued)

(56) References Cited

U.S. PATENT DOCUMENTS 9,518,333 B2    12/2016 Mag et al.
9,663,869 B2    5/2017 Demers et al.
(Continued)

FOREIGN PATENT DOCUMENTS

CN    104155872    11/2014
CN    105306632    2/2016
(Continued)

OTHER PUBLICATIONS

Extended European Search Report dated Nov. 22, 2023 issued in European Patent Application No. 21829227.4.
(Continued)

*Primary Examiner* — Michael Zhang
(74) *Attorney, Agent, or Firm* — Nixon & Vanderhye, P.C.

(57) ABSTRACT

An electronic device according to an embodiment may include cover glass and a housing on which the cover glass is seated. The housing includes a metal frame comprising a metal material, and on the metal frame, a seating surface for mounting the cover glass may be formed. The metal frame may include: a first region forming at least a portion of a side surface of the electronic device; and a second region to which the cover glass is attached, wherein an anodizing layer including nickel (Ni) may be arranged in the first region, and an anodizing layer that does not include nickel may be arranged in the second region.

20 Claims, 14 Drawing Sheets

(58) Field of Classification Search
CPC ... H04M 1/0202; H04M 1/026; C25D 11/243; C25D 11/022; C25D 11/18; C25D 11/246; C25D 11/12
See application file for complete search history.

(56) References Cited

U.S. PATENT DOCUMENTS

| | | | |
|---|---|---|---|
| 2011/0186438 A1 | 8/2011 | Son | |
| 2011/0284383 A1* | 11/2011 | Cabot | C23C 28/04 |
| | | | 205/50 |
| 2012/0044123 A1 | 2/2012 | Rothkopf et al. | |
| 2012/0120570 A1 | 5/2012 | Shin et al. | |
| 2013/0153429 A1 | 6/2013 | Khosla | |
| 2017/0013735 A1 | 1/2017 | Choi et al. | |
| 2017/0295267 A1* | 10/2017 | Jiang | H01Q 1/38 |
| 2019/0062939 A1* | 2/2019 | Curran | H05K 5/04 |
| 2019/0112726 A1 | 4/2019 | Takaichi et al. | |
| 2019/0159355 A1 | 5/2019 | Baek et al. | |
| 2019/0382911 A1* | 12/2019 | Curran | B32B 15/017 |
| 2021/0004058 A1 | 1/2021 | Lim et al. | |
| 2021/0363654 A1* | 11/2021 | Wu | C25D 11/30 |

FOREIGN PATENT DOCUMENTS

| | | |
|---|---|---|
| CN | 105468198 | 4/2016 |
| CN | 105983815 | 10/2016 |
| CN | 106435686 | 12/2018 |
| CN | 109161950 | 1/2019 |
| CN | 110499524 | 11/2019 |
| CN | 111147633 | 5/2020 |
| KR | 10-0892995 | 4/2009 |
| KR | 10-2012-0052758 | 5/2012 |
| KR | 10-1169960 | 8/2012 |
| KR | 10-2013-0055661 | 5/2013 |
| KR | 10-2016-0149792 | 12/2016 |
| KR | 10-2017-0006709 | 1/2017 |
| KR | 10-2018-0104517 | 9/2018 |
| KR | 10-2019-0098607 | 8/2019 |
| KR | 10-2019-0135090 | 12/2019 |
| KR | 10-2101890 | 4/2020 |

OTHER PUBLICATIONS

Korean Notice of Patent Grant issued Nov. 11, 2024 in corresponding Korean Patent Application No. 10-2020-0076697.
International Search Report for PCT/KR2021/007341 mailed Oct. 12, 2021, 7 pages.
Written Opinion of the ISA for PCT/KR2021/007341 mailed Oct. 12, 2021, 3 pages.

* cited by examiner

ELECTRONIC DEVICE HAVING HOUSING COMPRISING METAL MATERIAL

CROSS-REFERENCE TO RELATED APPLICATIONS

This application is a continuation of International Application No. PCT/KR2021/007341 designating the United States, filed on Jun. 11, 2021, in the Korean Intellectual Property Receiving Office and claiming priority to Korean Patent Application No. 10-2020-0076697, filed on Jun. 23, 2020, in the Korean Intellectual Property Office, the disclosures of which are incorporated by reference herein in their entireties.

BACKGROUND

Field

The disclosure relates to an electronic device including a housing including a metal material.

Description of Related Art

Recently, manufacturers have come to tend to strengthen the design aspects of electronic devices. In particular, cases of applying a metal material (e.g., aluminum) that is capable of implementing a luxurious appearance while increasing the rigidity of a product to electronic devices are increasing.

When an aluminum metal material is used for the appearance of an electronic device, manufacturers may improve erosion resistance and wear resistance of the aluminum metal through an anodizing process. The anodizing process may refer to an electrochemical process that forms an oxide film ($Al_2O_3$) on the aluminum metal. After the oxide film is formed on the aluminum metal, a coloring process of adding a pigment and a pore sealing process of filling micropores in the oxide film in order to prevent/restrict the pigment-added oxide film from peeling to the outside may be sequentially performed.

Meanwhile, recent electronic devices (e.g., smartphones) tend to adopt bezel-less designs in consideration of functional and aesthetic factors. The decrease of the thickness of a bezel may decrease the weight of the electronic device, so that the electronic device is improved in portability and convenience, and the increase of a display screen may increase the user's immersion and concentration on content.

A display has been bonded to a metal frame forming the appearance of an electronic device using a base tape, but with the decrease of the thickness of a bezel, there is a trend to change the base tape to a liquid adhesive. The base tape requires a width for ensuring an adhesive force, but unlike the base tape, the liquid adhesive is capable of ensuring an adhesive force without restriction on the width.

After the anodizing process is applied to a metal frame of an electronic device, a pore sealing process for preventing/restricting the peeling of a pigment added to an oxide film formed on the metal frame and the corrosion of an aluminum metal may be performed using a pore sealing agent containing a nickel (Ni) component. Since the nickel component is contained in the pore sealing agent, it is possible to improve the durability of the appearance of the electronic device and to quickly prevent/restrict the peeling of the pigment in the pore-sealing process.

However, since the nickel component is a hazardous substance and is subject to regulations, separate washing and elution processes are required to remove the nickel component on the surface after the pore sealing process. When heat is applied to the surface according to the separate elution process, the surface energy for the liquid adhesive is reduced. When a surface has reduced surface energy for a liquid adhesive, it may refer to the adhesiveness of the surface being reduced, wherein the corresponding surface may be poor in degree of adhesiveness to another structure (e.g., a cover glass).

SUMMARY

Embodiments of the disclosure improve the adhesiveness of a bonding area to which a structure is attached while maintaining the durability of an area exposed to the outside as an anodizing process is performed using different pore sealing agents.

According to an example embodiment, an electronic device may include: a cover glass disposed on a front surface of the electronic device, and a housing on which the cover glass is seated. The housing may include: a metal frame comprising a metal material and the metal frame may be provided with a seating surface on which the cover glass is seated. The metal frame of the housing may include: a first area forming at least a portion of a side surface of the electronic device and a second area to which the cover glass is attached, a nickel (Ni)-containing anodized layer may be disposed in the first area of the metal frame, and a nickel-free anodized layer may be disposed in the second area of the metal frame.

The wearable electronic device according to an example embodiment may include: a wearing member comprising a wearing portion capable of being worn on a part of a body and a housing including a coupling structure to which the wearing member is capable of being coupled. The housing may include: a metal frame including a first area forming a side surface of the wearable electronic device and a second area extending from the first area to inside of the wearable electronic device. The wearable electronic device may include a cover glass disposed to define a front surface of the wearable electronic device and seated on the second area of the metal frame, a nickel (Ni)-containing anodized layer may be disposed in the first area of the metal frame, and a nickel-free anodized layer may be disposed in the second area of the metal frame.

According to various example embodiments of the disclosure, it is possible to improve the adhesiveness of a bonding region while maintaining the durability of an appearance area of an electronic device.

According to various example embodiments of the disclosure, in a housing containing a metal material of an electronic device, it is possible to implement a plurality of specifications for a housing including a metal frame by performing different anodizing processes on an area of at least one portion of the housing.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
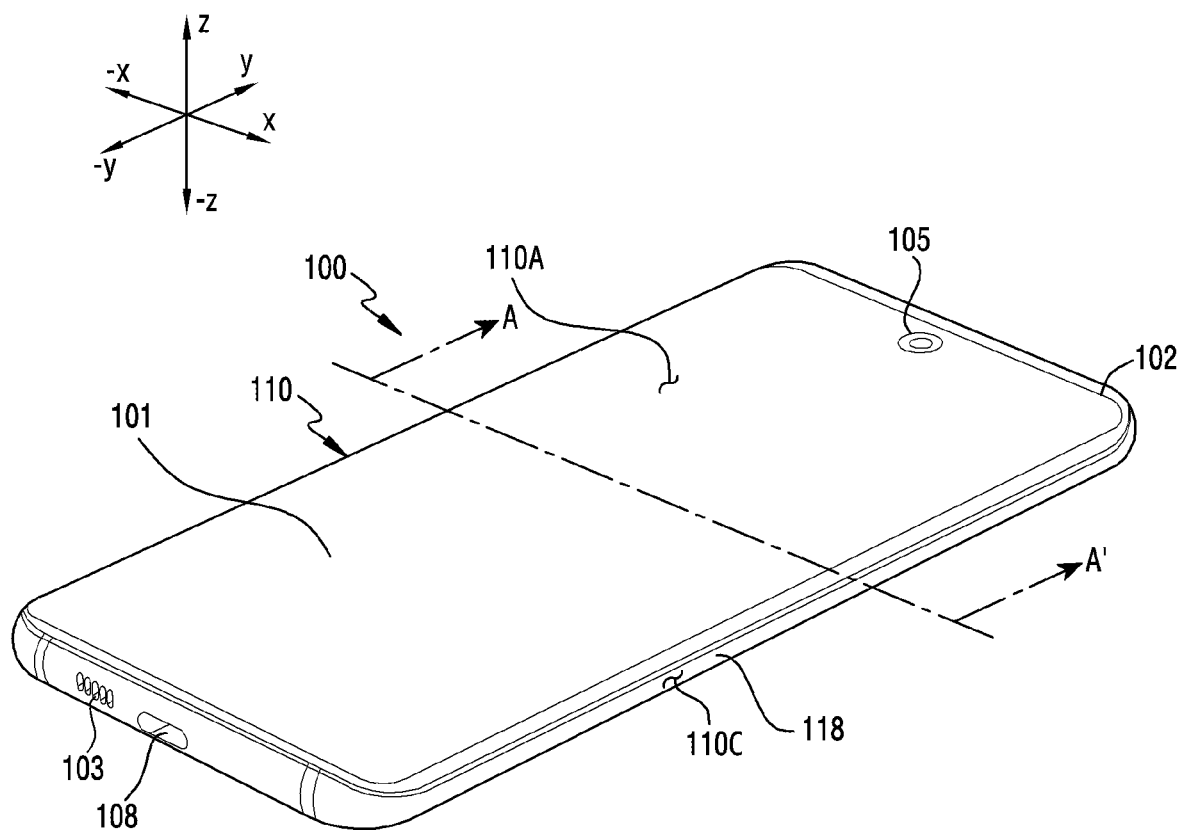
FIG. 1A is a perspective view illustrating the front surface of an electronic device according to various embodiments.
Figure 1B:
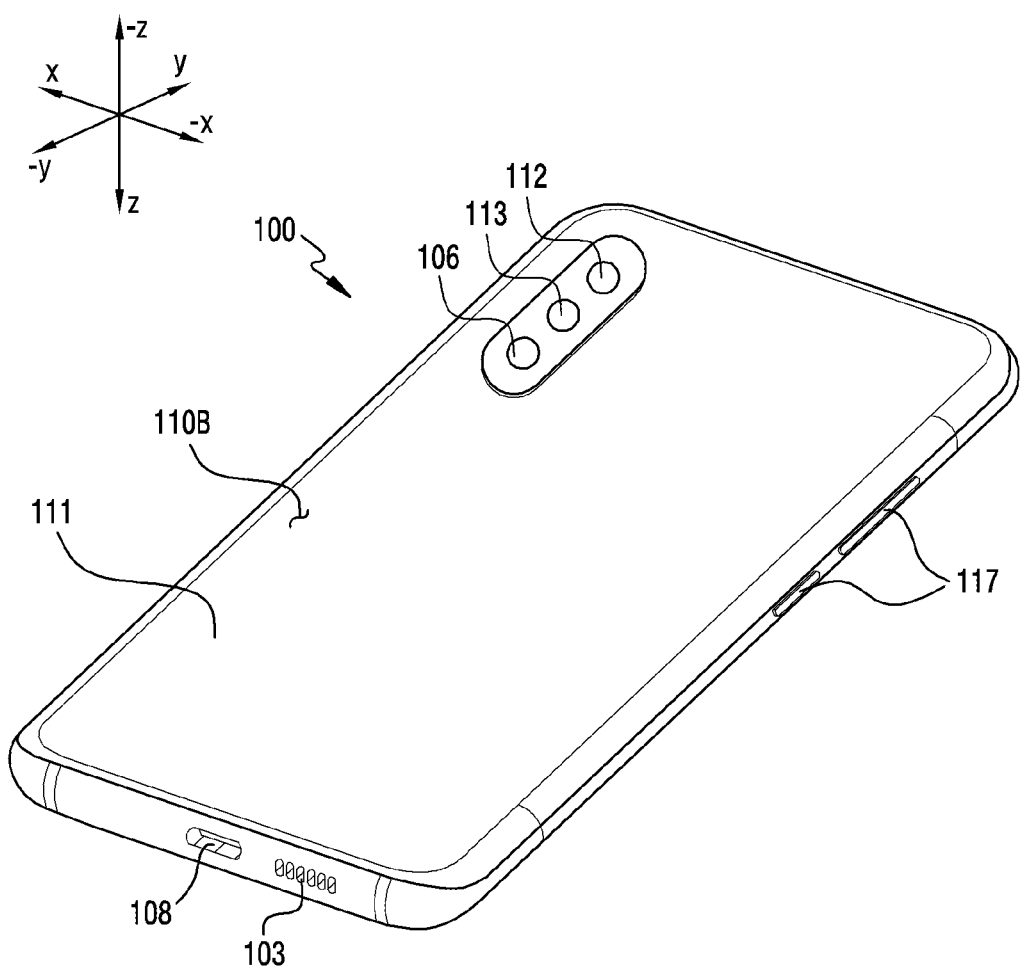
FIG. 1B is a perspective view illustrating the rear surface of the electronic device of FIG. 1A according to various embodiments.

FIG. 1A is a perspective view illustrating the front surface of an electronic device according to various embodiments. FIG. 1B is a perspective view illustrating the rear surface of the electronic device of FIG. 1A according to various embodiments.

Referring to FIGS. 1A and 1B, in an embodiment, an electronic device 100 may include a housing 110 including a first surface (or a front surface) 110A, a second surface (or a rear surface) 110B, and a side surface (or a side wall) 110C surrounding the space between the first surface 110A and the second surface 110B. In an embodiment (not illustrated), the housing may refer to a structure forming a portion of the first surface 110A, the second surface 110B, and the side surface 110C in FIGS. 1A and 1B.

In an embodiment, at least a portion of the first surface 110A may be formed by a substantially transparent front plate 102 (e.g., a glass plate or a polymer plate including various coating layers). In an embodiment, the front plate 102 may include a curved portion bent and seamlessly extending from the first surface 110A toward the rear plate 111 in at least one side edge portion.

In an embodiment, the second surface 110B may be formed by a substantially opaque rear plate 111. The rear plate 111 may be formed of, for example, coated or colored glass, ceramic, polymer, metal (e.g., aluminum, stainless steel (STS), or magnesium), or a combination of two or more of these materials. In an embodiment, the rear plate 111 may include, in at least one side edge portion, a curved portion bent and extending seamlessly from the second surface 110B toward the front plate 102.

In an embodiment, the side surface 110C may be defined by a side bezel structure (or a "side member" or a "side wall") 118, which is coupled to the front plate 102 and the rear plate 111 and includes metal and/or polymer. In an embodiment, the rear plate 111 and the side bezel structure 118 may be integrally configured, and may include the same material (e.g., a metal material such as aluminum).

In an embodiment, the electronic device 100 may include at least one of a display 101, an audio module 103, a sensor module (not illustrated), camera modules 105, 106, 112, and 113, key input devices 117, and a connector hole 108. In an embodiment, in the electronic device 100, at least one of the components (e.g., the key input devices 117) may be omitted, or other components may be additionally included. For example, the electronic device 100 may include a sensor module (not illustrated). For example, in an area provided by the front plate 102, a sensor, such as a proximity sensor or an illuminance sensor, may be integrated into the display 101 or disposed at a position adjacent to the display 101. In an embodiment, the electronic device 100 may further include a light-emitting element, and the light-emitting element may be disposed at a position adjacent to the display 101 in the area provided by the front plate 102. For example, the light-emitting element may provide the state information about the electronic device 100 in an optical form. In an embodiment, the light-emitting element may provide, for example, a light source that is interlocked with the operation of the camera module 105 disposed on the front surface. For example, the light-emitting element may include an LED, an IR LED, and a xenon lamp.

The display 101 may be visible through, for example, a substantial portion of the front plate 102. In an embodiment, the edges of the display 101 may be provided to be substantially the same as the outer peripheral shape (e.g., a curved surface) of the front plate 102 adjacent thereto. In an embodiment (not illustrated), the distance between the outer periphery of the display 101 and the outer periphery of the front plate 102 may be substantially constant in order to enlarge the visible area of the display 101. In an embodiment (not illustrated), a recess or an opening may be provided in a portion of a screen display area of the display 101, and other electronic components aligned with the recess or the opening, such as the camera module 105 disposed on the front surface, a proximity sensor (not illustrated), or an illuminance sensor (not illustrated), may be included.

In an embodiment (not illustrated), at least one of camera modules 106, 112, and 113, a fingerprint sensor (not illustrated), and a flash 106 may be included on the rear surface of the screen display area of the display 101. In an embodiment (not illustrated), the display 101 may be coupled to or disposed adjacent to a touch-sensitive circuit, a pressure sensor (or a "force sensor") capable of measuring the intensity of a touch (pressure), and/or a digitizer that detects an electromagnetic field-type stylus pen.

In an embodiment, the audio module 103 may include a microphone hole and a speaker hole. The microphone hole may include a microphone disposed therein so as to acquire external sound. In some embodiments, multiple microphones may be disposed in the microphone hole so as to detect the direction of sound. In an embodiment, the speaker hole and the microphone hole may be implemented as a single hole, or a speaker may be included without a speaker hole (e.g., a piezo speaker). In an embodiment, the speaker hole may include an external speaker hole and a call receiver hole 114.

In an embodiment, by including a sensor module (not illustrated), the electronic device 100 may generate an electrical signal or data value corresponding to an internal operating state or an external environmental condition. For example, the sensor module may further include, for example, a proximity sensor disposed on the first surface 110a of the housing 110, a fingerprint sensor incorporated in or disposed adjacent to the display 101, and/or a biometric sensor (e.g., an HRM sensor) disposed on the second surface 110B of the housing 110. In an embodiment, the electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

In an embodiment, the camera modules may include a first camera device 105 disposed on the first surface 110A of the electronic device 100, and second camera devices 112 and 113 and/or a flash 106 disposed on the second surface 110B. In an embodiment, the first camera device 105 and the second camera devices 112 and 113 may include one or more lenses, an image sensor, and/or an image signal processor. For example, the flash 106 may include a light-emitting diode or a xenon lamp. In an embodiment, two or more lenses (e.g., an infrared camera lens, a wide-angle lens, and a telephoto lens), and image sensors may be disposed on one surface of the electronic device 100.

In an embodiment, the key input devices 117 may be disposed on the side surface 110C of the housing 110. In an embodiment, the electronic device 100 may not include some or all of the above-mentioned key input devices 117, and the key input devices 117, which are not included in the electronic device 101, may be implemented in another form, such as soft keys, on the display 101. In an embodiment, the key input devices 117 may include at least a portion of a fingerprint sensor (not illustrated) disposed on the second surface 110B of the housing 110.

In an embodiment, the connector hole 108 may accommodate a connector configured to transmit and receive power and/or data to and from an external electronic device, and/or a connector configured to transmit and receive an audio signal to and from an external electronic device. For example, the connector hole 108 may include a USB connector or an earphone jack.

Figure 1C:
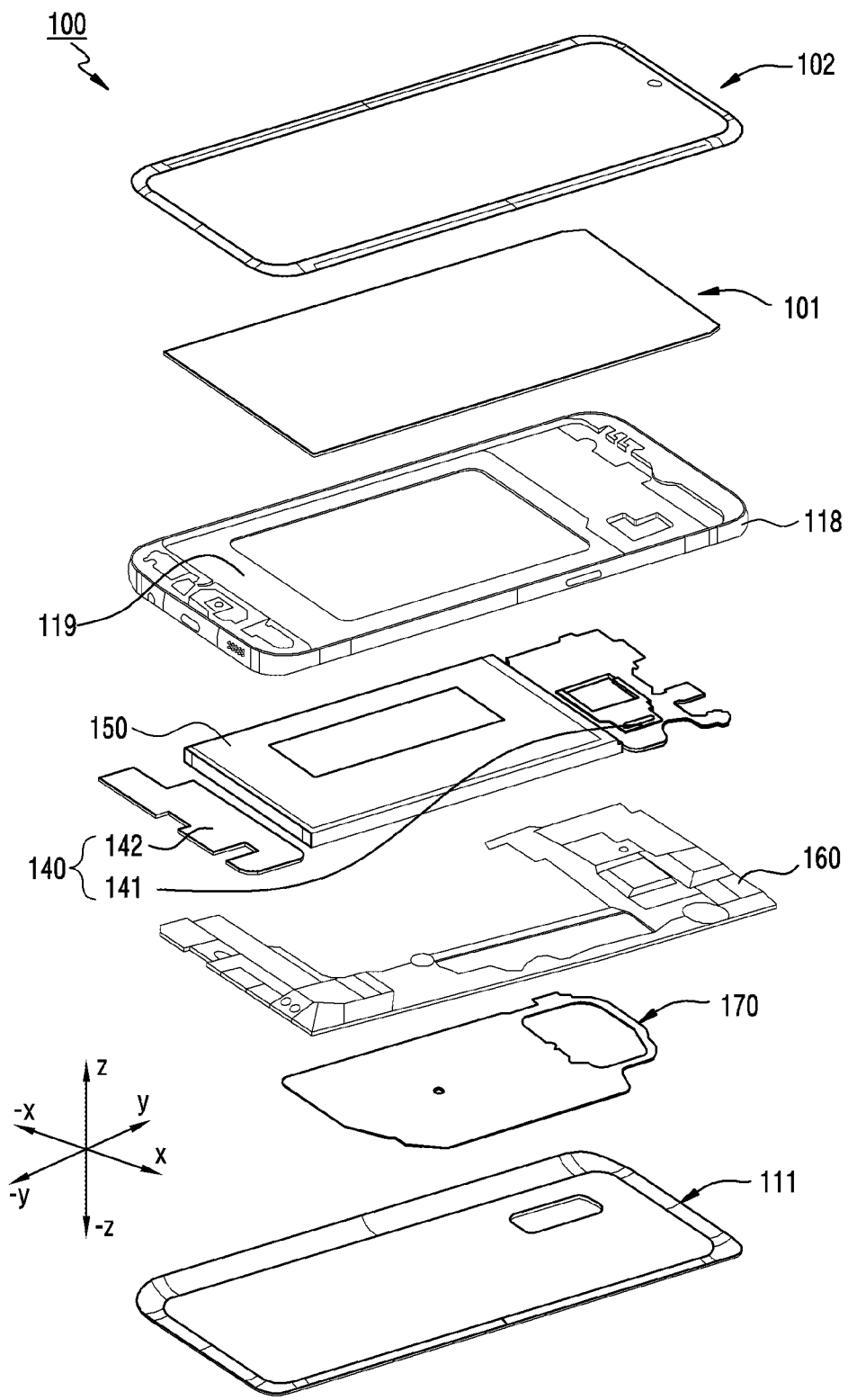
FIG. 1C is an exploded perspective view of an electronic device according to various embodiments.

FIG. 1C is an exploded perspective view of an electronic device according to various embodiments.

Referring to FIG. 1C, the electronic device 100 may include a display 101, a front plate 102 (or a "cover glass"), a rear plate 111, a side bezel structure 118, a first support member 119, a printed circuit board 140, a battery 150, a second support member 160 (e.g., a rear case), and/or an antenna 170. In an embodiment, at least one of the components of the electronic device 100 may be the same as or similar to at least one of the components of the electronic device 100 of FIGS. 1A and 1B. Thus, a description of components that correspond to, or are the same as or similar to, the components of the electronic device 100 of FIGS. 1A and 1B may be omitted.

In an embodiment, the first support member 119 may be disposed inside the electronic device 100 to be connected to the side bezel structure 118, or may be integrally configured with the side bezel structure 118. The first support member 119 may be made of, for example, a metal material and/or a non-metal (e.g., a polymer) material. The display 101 may be coupled to one surface of the first support member 119, and the printed circuit board 140 may be coupled to the other surface of the first support member 319.

In an embodiment, on the printed circuit board 140, a processor, a memory, and/or an interface may be mounted. The processor may include at least one of, for example, a central processing unit, an application processor, a graphics processing unit, an image signal processor, a sensor hub processor, or a communication processor. The memory may include, for example, a volatile memory or a non-volatile memory. The interface may include, for example, a high-definition multimedia interface (HDMI), a universal serial bus (USB) interface, an SD card interface, and/or an audio interface. The interface may electrically or physically connect, for example, the electronic device 100 to an external electronic device, and may include a USB connector, an SD card/an MMC connector, or an audio connector.

In an embodiment, the printed circuit board 140 may include a first printed circuit board 141 and a second printed circuit board 142 connected to the first printed circuit board 141 via a connector (not illustrated). However, the printed circuit board 140 of the disclosure is not limited to the above-described embodiment, and a printed circuit board 140 according to an embodiment (not illustrated) may be provided as a single board. In an embodiment, the printed circuit board 140 may be disposed on the same plane as the battery 150, and the printed circuit board 140 and the battery 150 may be disposed to avoid each other or to partially overlap each other.

In an embodiment, the battery 150 is a device for supplying power to at least one component of the electronic device 100, and may include, for example, a non-rechargeable primary battery, a rechargeable secondary battery, or a fuel cell. For example, at least a portion of the battery 150 may be disposed on substantially the same plane as the printed circuit board 140. The battery 150 may be integrally disposed inside the electronic device 100, or may be detachably disposed on the electronic device 100.

In an embodiment, the antenna 170 may be disposed between the rear plate 111 and the battery 150. In an embodiment, the antenna 170 may include a near field communication (NFC) antenna, a wireless charging antenna, and/or a magnetic secure transmission (MST) antenna. For example, the antenna 170 is capable of performing short-range communication with an external device or wirelessly transmitting/receiving power required for charging to/from an external device. In an embodiment, an antenna structure may be configured by a portion of the side bezel structure 118 and/or the first support member 119, or a combination thereof.

In an embodiment, the rear plate 111 may provide the rear surface (e.g., the second surface 110B in FIG. 3B) of the electronic device 100. The rear plate 111 may protect the electronic device 100 from an external impact or foreign substances.

In an embodiment, the electronic device 100 may include a display of a unibody structure. For example, a plurality of components among the components illustrated in FIGS. 1A, 1B and 1C (which may be referred to as FIGS. 1A to 1C) may be integrated configured with each other. For example, the side bezel structure 118, the first support member 119, and the rear plate 111 may be integrally configured with each other. In this case, the second support member 160 may also be integrally configured with the first support member 119 or may be omitted.

In an embodiment, at least a portion of the housing of the electronic device 100 may have a metal frame structure formed of a metal material. For example, the entire housing of the electronic device 100 may be formed of a metal frame. In another example, a partial area of the housing of the electronic device 100 corresponding to a side surface and an area in which the front plate 102 is disposed (bonded) may be formed of a metal frame, and another component (e.g., the rear plate 111) may be made of a non-metal material through, for example, injection molding. This is an example, and in various embodiments, a portion forming the overall appearance of the housing of the electronic device 100 may include a metal material, and even if not forming the appearance, a portion, to which the front plate 101 or the display panel may be attached, may also contain a metal material. In various embodiments disclosed herein, the term "metal frame" may be interpreted as a metal portion to which different anodizing treatments are applied in the electronic device 100 having a housing including a metal material.

Figure 2A:
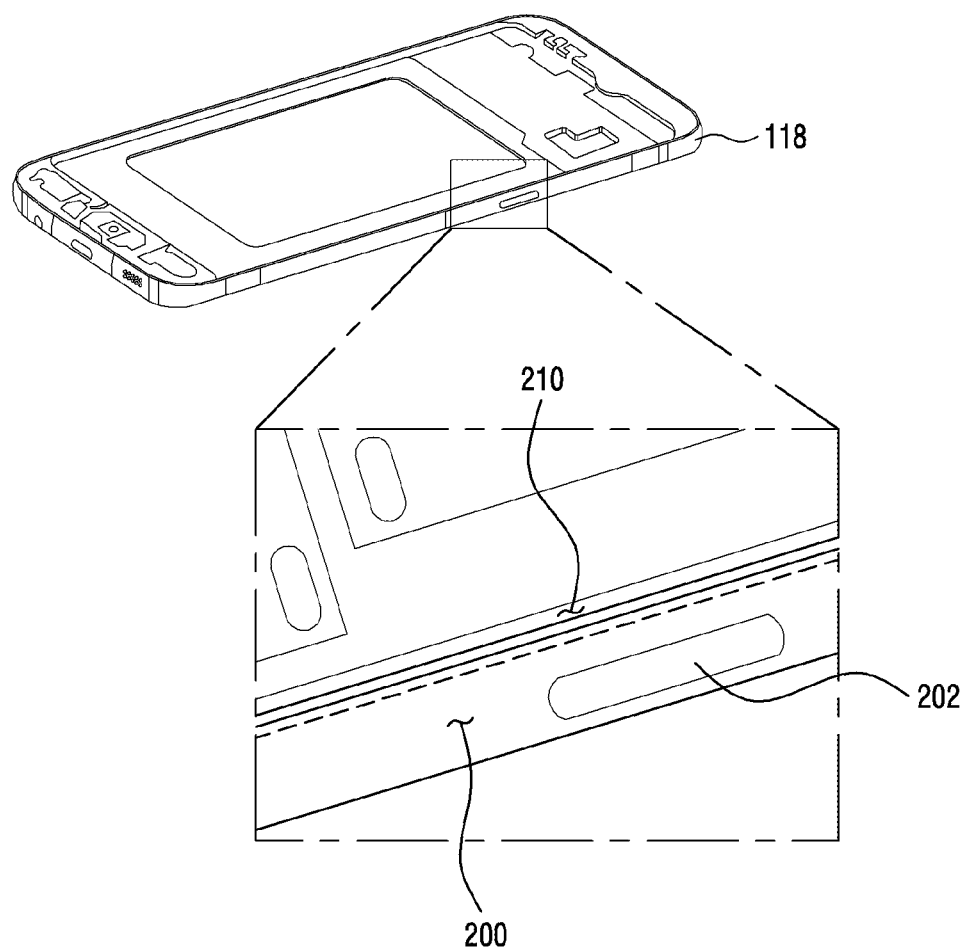
FIG. 2A is an enlarged perspective view of a portion of a metal frame according to various embodiments.
Figure 2B:
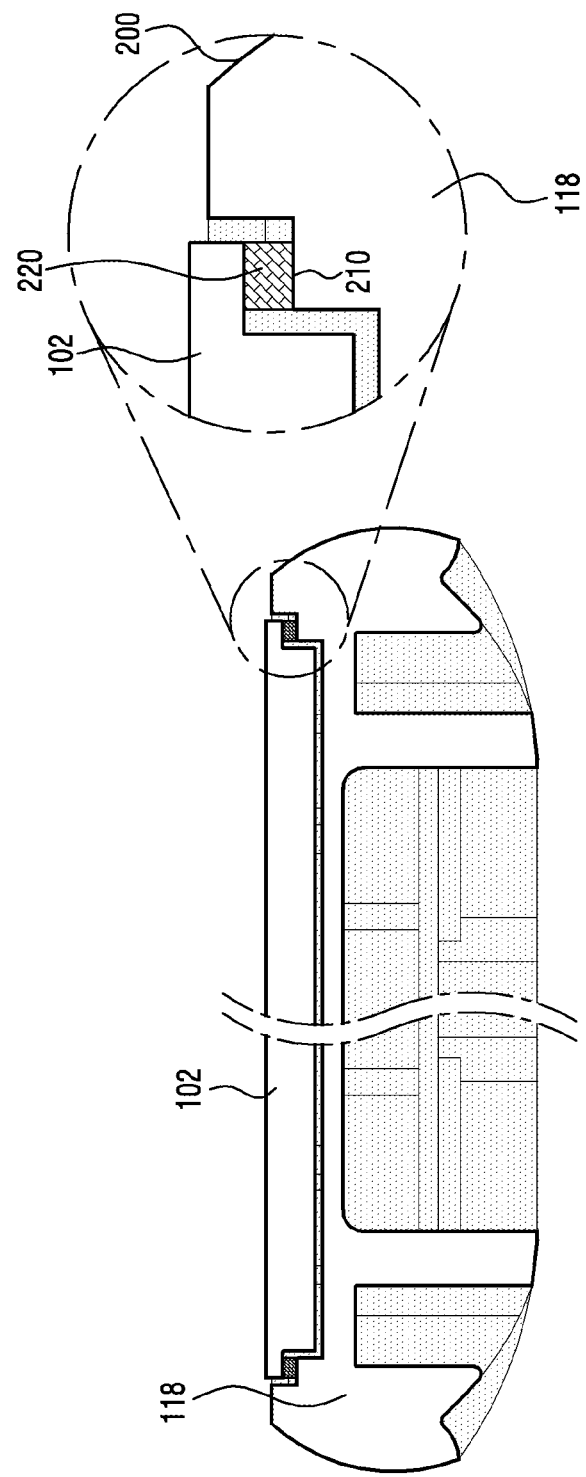
FIG. 2B is a cross-sectional view of the electronic device of FIG. 1A taken along line A-A' of FIG. 1A and viewed in the y-axis direction according to various embodiments.

FIG. 2A is a partial enlarged perspective view of a portion of a metal frame according to various embodiments. FIG. 2B is a cross-sectional view of the electronic device of FIG. 1A taken along line A-A' and viewed in the y-axis direction. The metal frame in FIGS. 2A and 2B may correspond to the side bezel structure 118 in FIGS. 1A to 1C. Accordingly, the description of the "side bezel structure 118" in FIGS. 1A to 1C may also be applied to the "metal frame 118" below. Similarly, the cover glass in FIG. 2B may correspond to the front plate 102 in FIGS. 1A to 1C, and hereinafter "front plate 102" may be expressed as a "cover glass 102".

Referring to FIGS. 2A and 2B, the metal frame 118 may include a first area 200 forming at least a portion of a side surface of an electronic device (e.g., the electronic device 100 in FIG. 1) and a second area 210 to which another structure (e.g., the front plate 102) may be attached. In an embodiment, the first area 200 of the metal frame 118 may be provided to be exposed to the outside (e.g., an outer surface of the electronic device) of the electronic device 100, and the second area 210 may be disposed inside the electronic device 100 such that another component (e.g., the cover glass) is disposed thereto. As described above, the metal frame 118 may be a portion corresponding to a metal material of the housing of the electronic device 100.

In an embodiment, an anodizing process may be performed to improve corrosion resistance and wear resistance of the metal frame 118. The anodizing process is a post-treatment process for an aluminum metal material and may refer, for example, to a process in which, after placing aluminum on a positive electrode, an oxide film is formed on the surface of the aluminum as oxygen molecules generated by an electrolyte (e.g., sulfuric acid ($H_2SO_4$)) are attached to the positive electrode. For example, when the anodizing process is performed on the metal frame 118 including an aluminum metal, an oxide film ($Al_2O_3$) may be formed on the surface of the metal frame 118. After the formation of the oxide film, a pore sealing process for filling micropores in the oxide film formed on the outer surface of the metal frame 118 with a sealing agent may be sequentially performed. In an embodiment, the first area 200 and the second area 210 are different in the pore sealing process of filling the micropores in the oxide film, but a description thereof will be provided in greater detail below with reference to FIG. 3.

In an embodiment, at least a portion of the first area 200 may include at least one hole 202. For example, the first area 200 may form a coupling structure with a physical key button (e.g., a side key) through the at least one hole 202.

In an embodiment, the first area 200 may have a constant thickness along the outer periphery of the metal frame 118, but the thickness of the first area 200 may be variously changed depending on the design of the manufacturer. For example, the first area 200 forming the left and right side edges of the metal frame 118 may be substantially thinner than the first area 200 forming the upper and lower ends of the metal frame 118.

In an embodiment, the second area 210 may be provided along at least a portion of the inner periphery of the metal frame 118. For example, the second area 210 may be provided in the entire area corresponding to the peripheral areas (e.g., the horizontal areas and vertical areas of the quadrilateral periphery) of the front plate 102 in the inner periphery of the metal frame 118. As another example, the second area 210 may be provided only in an area corresponding to a partial peripheral area (e.g., the vertical areas of the quadrilateral periphery) of the front plate 102 in the inner periphery of the metal frame 118. In an embodiment, the second area 210 may have a width corresponding to a thickness of about 1 mm to 1.5 mm. However, the width of the second area 210 is not limited to the above-mentioned thickness and may be variously changed depending on the manufacturer's design, the type of adhesive to be applied, and the material of a structure to be attached (e.g., glass, polymer, etc.).

In an embodiment, an adhesive layer 220 may be disposed between the second area 210 of the metal frame 118 and at least one area of the cover glass 102. For example, as a liquid adhesive member is applied to at least a portion of the second area 210, the adhesive layer 220 may be formed, and the second area 210 of the metal frame 118 and at least one area of the cover glass 102 may be bonded to each other with the formed adhesive layer 220.

Figure 3:
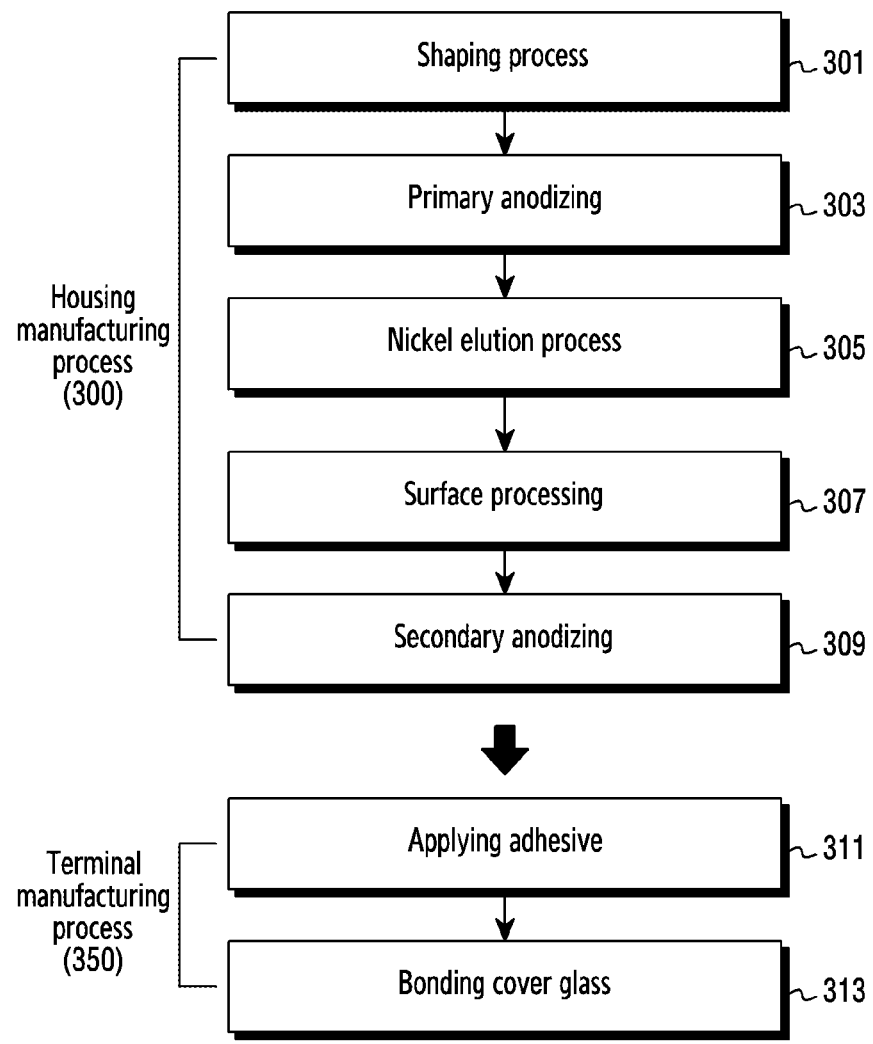
FIG. 3 is a flowchart illustrating an example manufacturing process of a metal frame and a process of coupling the metal frame with a cover glass according to various embodiments.
Figure 4:
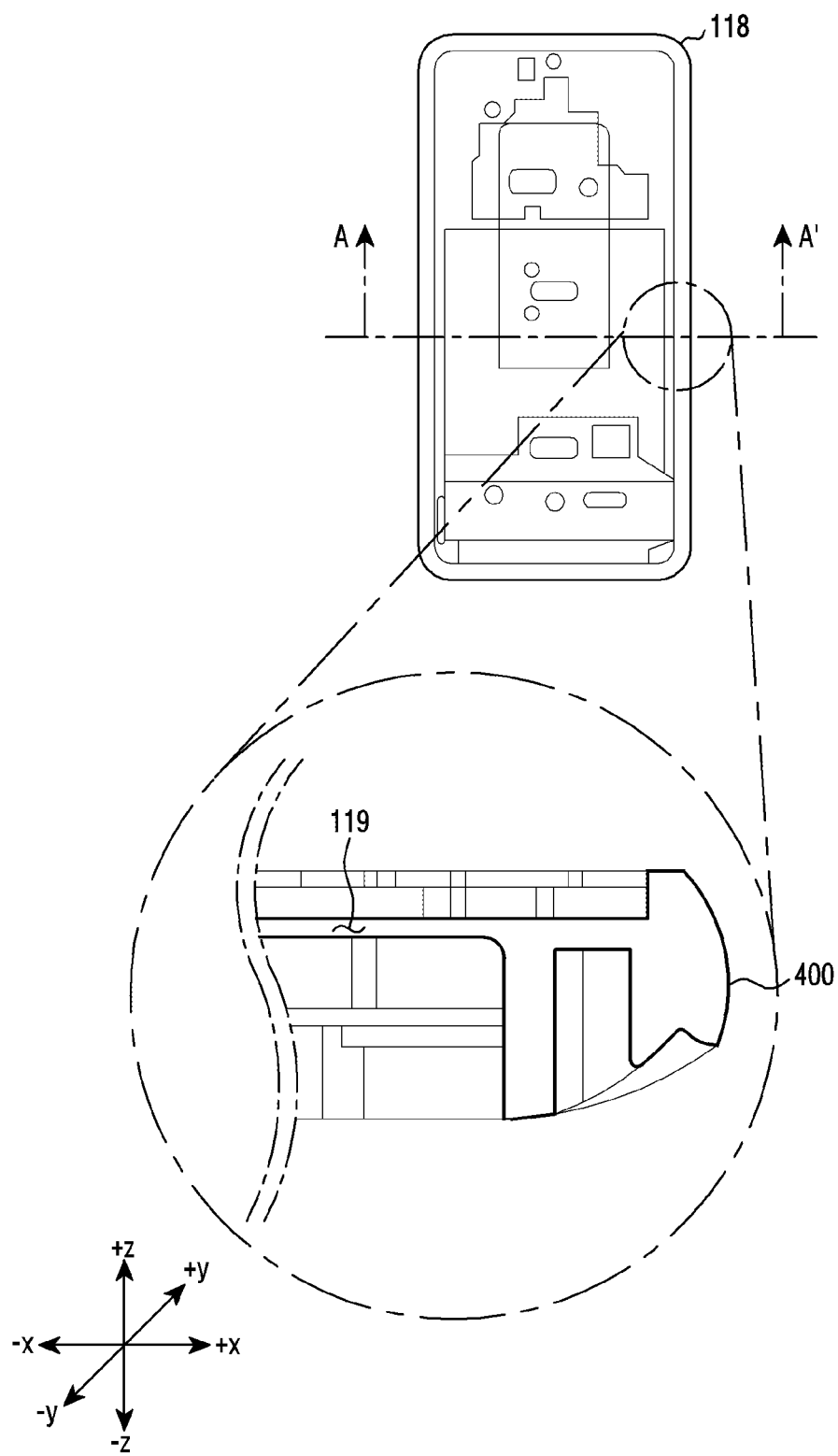
FIG. 4 is a diagram illustrating a partial area of a cross-sectional view of the metal frame and the metal frame taken along line A-A' in process 301 in FIG. 3 according to various embodiments.
Figure 5:
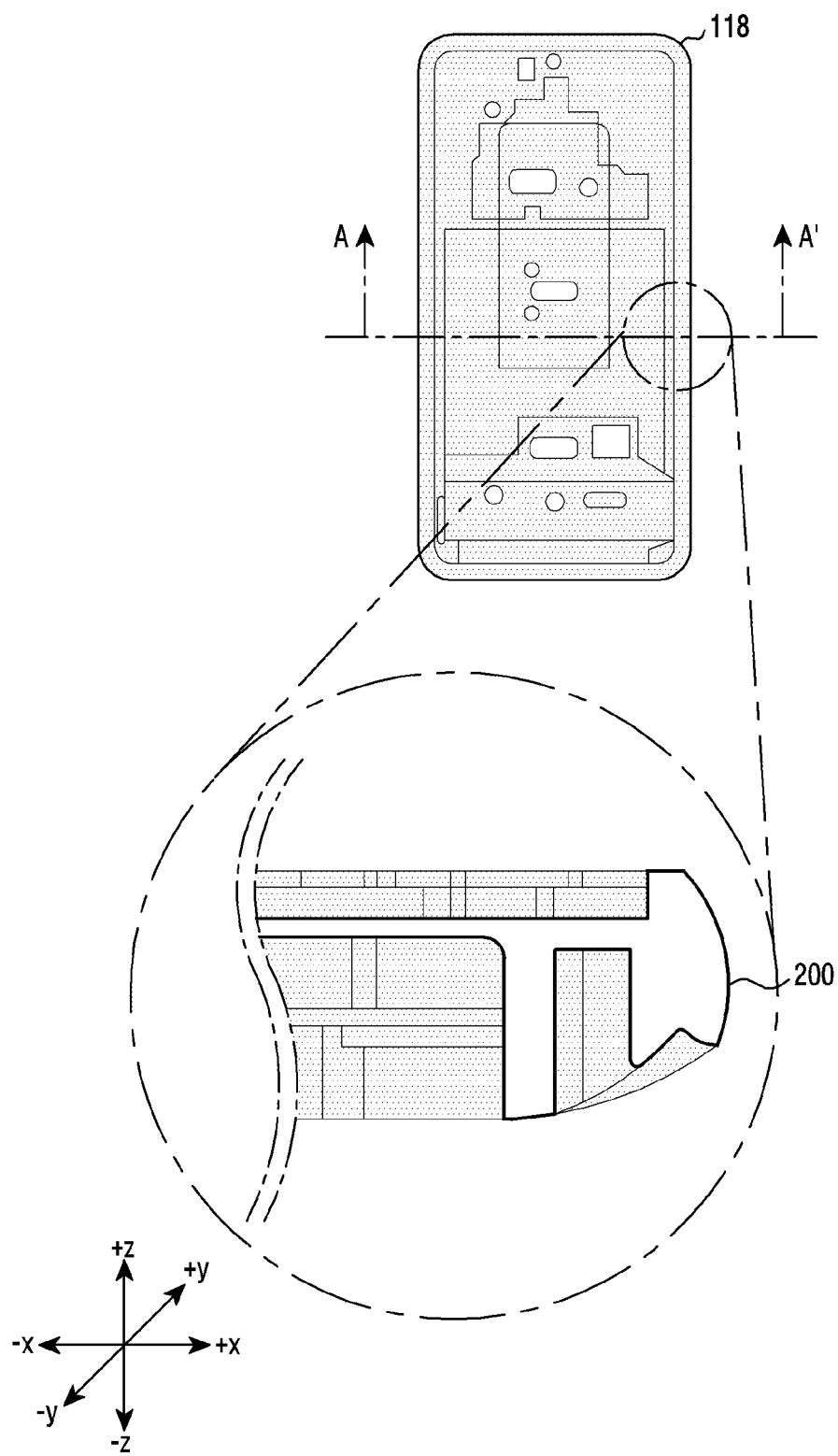
FIG. 5 is a diagram illustrating a partial area of a cross-sectional view of the metal frame and the metal frame taken along line A-A' in process 303 in FIG. 3 according to various embodiments.
Figure 6:
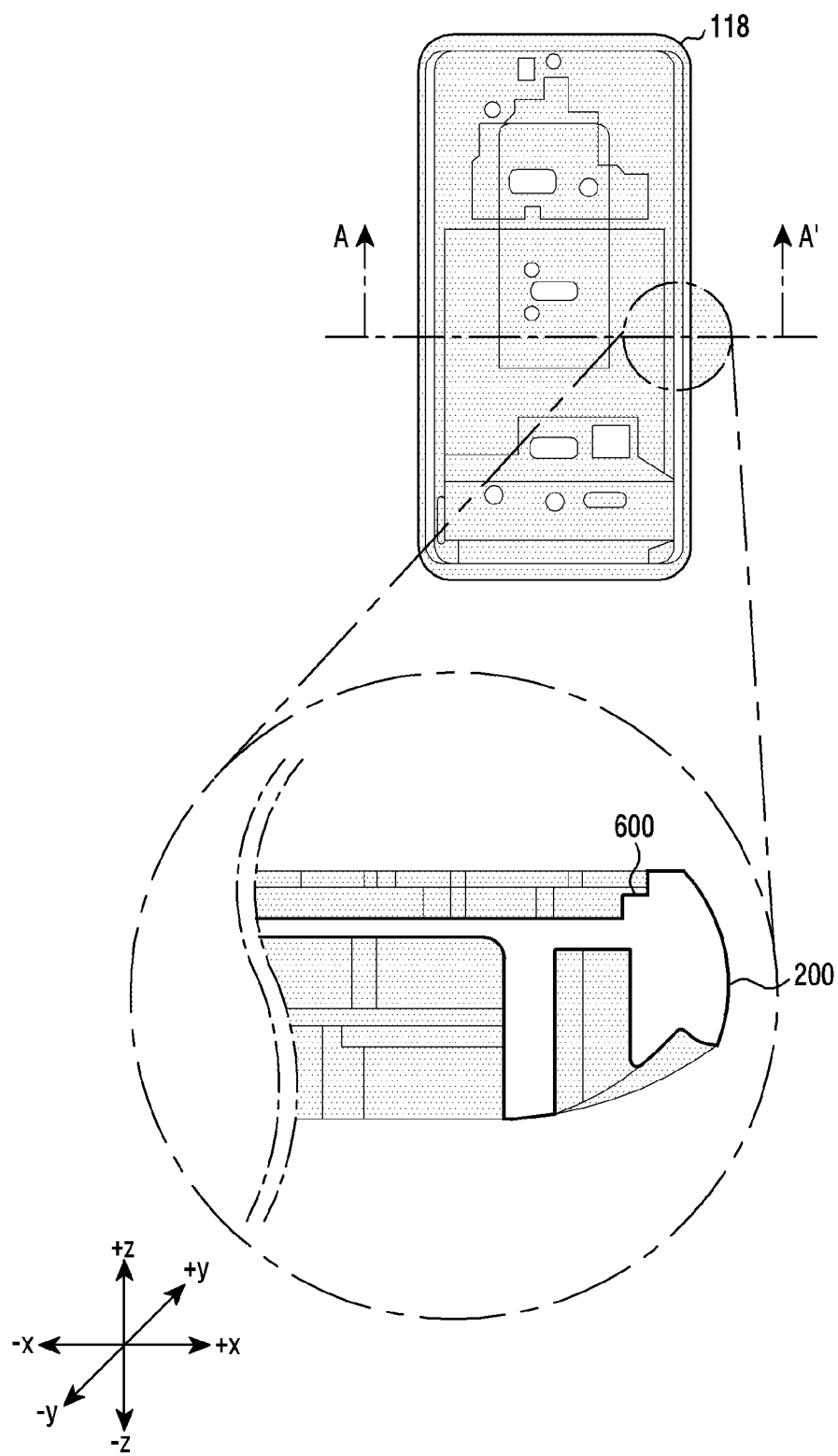
FIG. 6 is a diagram illustrating a partial area of a cross-sectional view of the metal frame and the metal frame taken along line A-A' in process 305 in FIG. 3 according to various embodiments.
Figure 7:
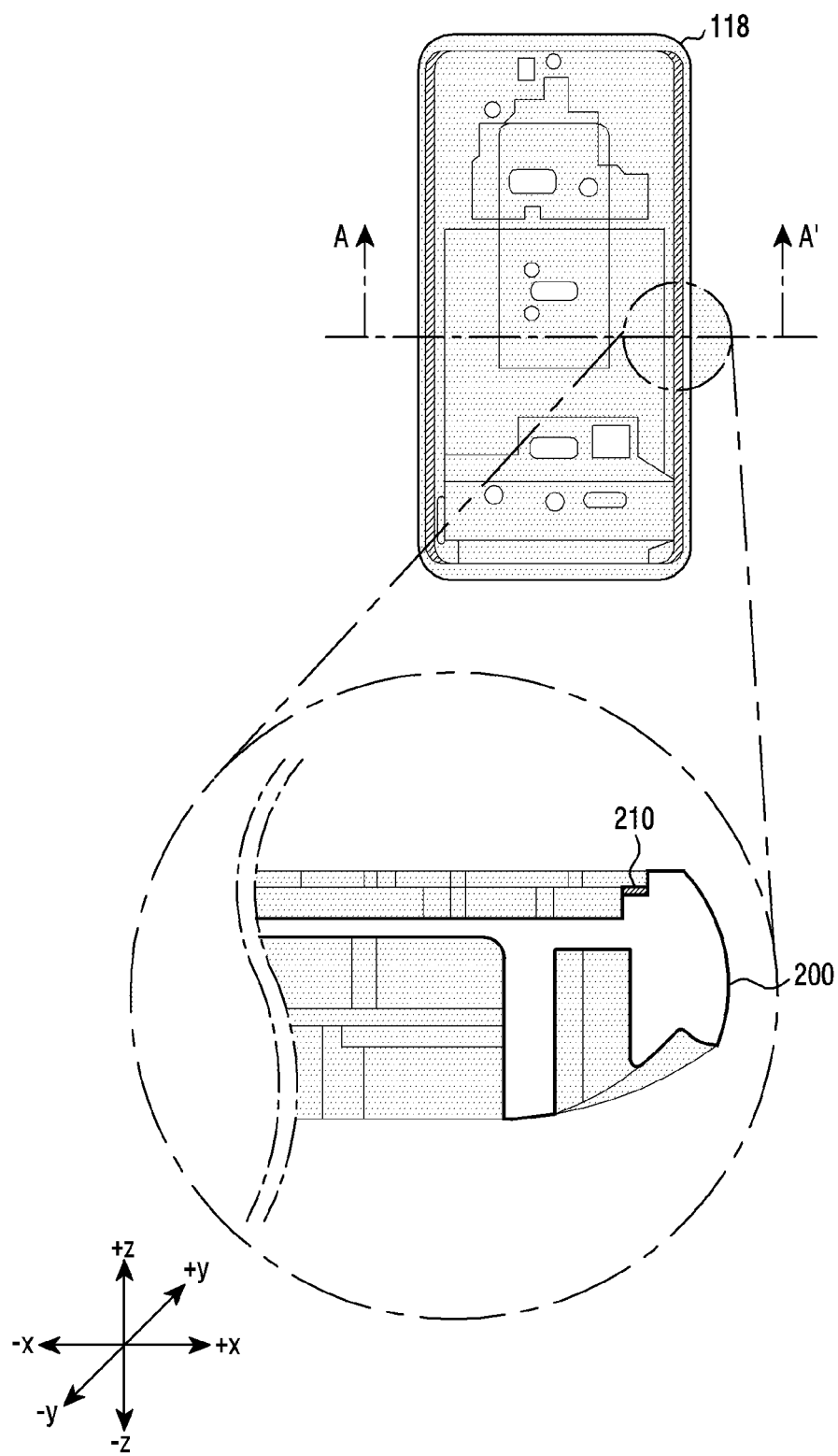
FIG. 7 is a diagram illustrating a partial area of a cross-sectional view of the metal frame and the metal frame taken along line A-A' in process 307 in FIG. 3 according to various embodiments.

FIG. 3 is a flowchart illustrating an example manufacturing process of a metal frame of the electronic device 100 and a process of coupling the metal frame with a cover glass according to various embodiments. FIG. 4 is a diagram illustrating a partial area of a cross-sectional view of the metal frame and the metal frame taken along line A-A' and viewed in the +z-axis direction in process 301 in FIG. 3 according to various embodiments. FIG. 5 is a diagram illustrating a partial area of a cross-sectional view of the metal frame and the metal frame taken along line A-A' and viewed in the +z-axis direction in process 303 in FIG. 3 according to various embodiments. FIG. 6 is a diagram illustrating a partial area of a cross-sectional view of the metal frame and the metal frame taken along line A-A' and viewed in the +z-axis direction in process 305 in FIG. 3 according to various embodiments. FIG. 7 is a diagram illustrating a partial area of a cross-sectional view of the metal frame and the metal frame taken along line A-A' and viewed in the +z-axis direction in process 307 in FIG. 3 according to various embodiments.

The metal frame manufacturing process of FIG. 3, it will be described with reference to the configurations of FIGS. 4, 5, 6 and 7 (which may be referred to as FIGS. 4 to 7).

Referring to FIG. 3, the metal frame (e.g., the metal frame 118 in FIG. 1C) manufacturing process may include a housing manufacturing process 300 and a terminal manufacturing process 350. The housing manufacturing process 300 may include a shaping process 301, a primary anodizing process 303, a nickel elution process 305, a surface processing process 307, and a secondary anodizing process 309.

According to an embodiment, the shaping process 301 may include a CNC process and an insert injection-molding process. For example, the appearance of the housing of the electronic device 100 may be provided through a first CNC process. In an embodiment, in the first CNC process, a guide processing operation for a metal member (e.g., an aluminum metal) may be performed, and an insert injection-injection operation may be performed for the guide generated through the first CNC process. In addition, an operation of internal shaping of the housing and/or an operation of external shaping of the housing may be sequentially performed. For example, the metal frame 118 including the support member 119 and the first area 400 may be formed through the shaping process 301 on an aluminum metal member. According to an embodiment, the surface of the metal frame 118 generated in the shaping process 301 may include an aluminum material, which has not been subjected to post-treatment (e.g., anodizing).

According to an embodiment, since the first area 400 (refer to FIG. 4), which has not been subjected to post-treatment, is an area exposed to the outside, the primary anodizing process 303 may be performed to prevent/reduce discoloration and adsorption of contaminants and to improve durability.

According to an embodiment, the housing manufacturing process 300 may include a primary anodizing process 303 for the surface of the metal frame 118 as illustrated in FIG. 5. The primary anodizing process 303 may be performed in the order of a degreasing and rinsing process of removing contaminants on the aluminum metal, an etching process of removing a natural oxide layer, a desmut process of removing a smut component, and an oxide film ($Al_2O_3$) forming process of a surface of a metal frame 118 of the electronic device 100, a coloring process of introducing a dye pigment into the formed oxide film, and a pore sealing process of filling micropores in the oxide film. However, some processes (e.g., the coloring process) among the above-described series of processes may be omitted.

According to an embodiment, in the primary anodizing process 303, the coloring process of introducing a dye pigment into the micropores (e.g., 10 nm to 20 nm diameter holes) in the oxide film formed on the metal frame 118 and the pore sealing process of filling the pores with a pore sealing agent containing nickel may be performed. Compared with the pore sealing agent, which does not contain nickel, when a pore sealing agent containing nickel is used in the pore sealing process, the micropores may be quickly filled before the dye pigment introduced in the coloring process is peeled off. According to an embodiment, the first area 200 on which the primary anodizing treatment has been performed with a pore sealing agent including nickel may have little change in a color implemented in the coloring process, and may be improved in corrosion resistance and durability.

According to an embodiment, the housing manufacturing process 300 may include a nickel elution process 305 of removing nickel after the pore sealing process in which nickel is included. Since the nickel present on the outer surface of the housing is a component harmful to the human body, when a pore sealing agent using nickel is used, it is possible to prevent/reduce the harmful effect on a human body by removing the nickel.

In FIG. 3, the nickel elution process 305 has been described as a separate process performed after the primary anodizing process 303, but in various embodiments, the nickel elution process 305 may be included as a part of the primary anodizing process 303. For example, nickel elution may be performed during the primary anodizing process 303.

According to an embodiment, the housing manufacturing process 300 may include a surface processing process 307. For example, a bonding area (e.g., the second area 600) may be generated through the second CNC process. In an embodiment, the second CNC process may include a process of processing the second area 600 to which a cover glass may be attached in the metal frame 118, a hole processing process, and a guide removing operation for the CNC process. According to an embodiment, the second area 600 of the metal frame 118 generated in the surface processing process 307 may include an aluminum material, which has not been subjected to post-treatment. Unlike the first area 400 of FIG. 4, the second area 600 (refer to FIG. 6), which has not been subjected to the post-treatment, may be subjected to a secondary anodizing process 309 to improve adhesiveness.

According to an embodiment, the housing manufacturing process 300 may include the secondary anodizing process 309. As illustrated in FIG. 7, the secondary anodizing process may be applied to the bonding area of the metal frame 118. Compared with the primary anodizing treatment in FIG. 5, the secondary anodizing treatment may be have a difference in whether or not the pore sealing agent used in the pore sealing process contains nickel.

According to an embodiment, the pore sealing process of filling pores in an oxide film with a pore sealing agent, which does not contain nickel, may be performed on the second area (e.g., the second area 600 in FIG. 6) of the metal frame 118 in the secondary anodizing process 309. When the pore sealing agent including nickel is used in the pore sealing process, a separate elution process of removing the nickel component present on the metal surface may be additionally performed. The elution process is performed at a high temperature (e.g., 100° C.), and since heat is applied on the metal surface, a component related to the adhesiveness of the material may also be removed together with the nickel component. For example, even molecules involved in the implementation of adhesiveness may be removed together with the nickel. In an embodiment, when a pore sealing agent, which does not contain nickel, is used in the pore sealing process performed on the second area 600 of the metal frame 118, the elution process may be omitted. Since the elution process is omitted, a component related to adhesiveness to a metal material may be maintained, so the second area 210 of the metal frame 118 may have higher adhesiveness than the first area 200.

According to an embodiment, when the housing manufacturing process 300 is performed, a nickel-contained anodized layer may be located in the first area 200 of the metal frame 118 of the housing, and a nickel-free anodized layer may be located in the second area 210. In an embodiment, the surface strength of the first area 200 in which the nickel-containing anodized layer is located may be greater than the surface strength of the second area 210 in which the nickel-free anodized layer is located. The fact that the surface strength of the first area 200 is greater than the surface strength of the second area 210 may refer, for example, to the durability of the first area 200 to an external impact and/or environment being higher than the durability of the second area 210.

When the manufacturing of the housing of the electronic device 100 is completed according to the housing manufacturing process 300, a terminal manufacturing process 350 of coupling the components of the electronic device 100 to the housing may be performed. The electronic device 100 may be referred to as a terminal, a user terminal, or a set. In addition, the housing manufacturing process 300 and the terminal manufacturing process 350 may be performed through a series of operations in the same place, but may be performed with differences in place and time.

According to an embodiment, the terminal manufacturing process 300 may include an adhesive application process 311. For example, an adhesive may be applied to the second area 210 of the metal frame 118. In an embodiment, the adhesive may include at least one of a liquid adhesive member (e.g., a glue-type adhesive or a gel-type adhesive) and a base-free adhesive member (e.g., a base-free tape). For example, the glue-type adhesive may be applied to at least a portion (e.g., the middle portion of the second area) of the second area 210, which has been subjected to the secondary anodizing treatment, to form an adhesive layer (e.g., the adhesive layer 220 in FIG. 2B). In an embodiment, the liquid adhesive member and the base-free adhesive member may maintain adhesiveness without being affected by the width of the second area 210. In particular, since the nickel elution process 305 has not been applied to the second area 210, adhesiveness is improved compared to the case in which nickel is included, due to the nickel-free pore sealing agent according to the secondary anodizing treatment.

According to an embodiment, process 313 of attaching a cover glass (e.g., the cover glass 102 in FIG. 2B) to the second area 210 of the metal frame 118 may be performed. According to an embodiment, the cover glass 102 may be bonded to the metal frame 118 using at least one of a lamination bonding method or a side bonding method in process 313. The lamination bonding method may refer, for example, to a method in which an adhesive applied to at least a portion of the second area 210 of the metal frame 118 forms an adhesive layer, and the cover glass 102 is bonded to the upper surface of the adhesive layer. In the side bonding method, an adhesive is applied to at least a portion of the second area 210 and at least a portion of a third area (e.g., the side region 1030 in FIG. 10) of the metal frame 118, and the cover glass 102 is attached using the adhesive applied to at least a portion of the second area 210 and at least a portion of the third area.

In various embodiments disclosed herein, an example in which the cover glass 102 is bonded to the second area 210 of the metal frame 118 of the housing has been mainly described, but this is for convenience of description and embodiments are not limited to the illustrated examples. The disclosure is applicable to various embodiments of attaching a component of the electronic device 100 to an area in which adhesiveness is improved using a nickel-free pore sealing agent. For example, the same description may be applicable in a corresponding manner even when a display panel that is separate from the cover glass 102 or a display panel integrated with the cover glass 102 is bonded to the second area 210. In addition, the same description is also applicable to an embodiment in which a touch panel, a polarization layer, or an injection-molded structure (e.g., a rear cover) is bonded to a metal area of the housing.

Figure 8:
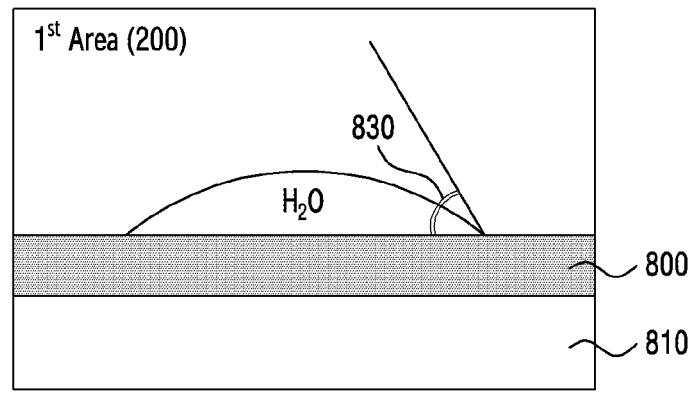
FIG. 8 is a diagram illustrating, in comparison, water contact angles in a first area and a second area of a metal frame according to various embodiments.
Figure 8:
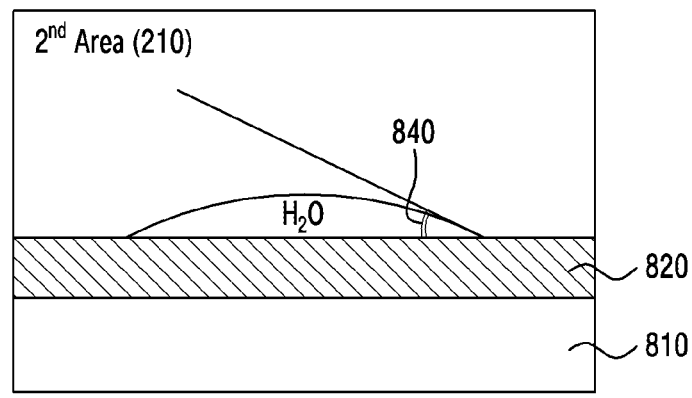

FIG. 8 is a diagram illustrating, in comparison, water contact angles in a first area and a second area of a metal frame according to various embodiments.

Referring to FIG. 8, the first area 200 of the metal frame (e.g., the metal frame 118 in FIG. 1C) may include a nickel-containing anodized layer 800 (e.g., the first anodized layer). The nickel-containing anodized layer 800 may be formed on the surface of the aluminum metal 810 according to process 303 in FIG. 3. In an embodiment, the second area 210 of the metal frame 118 may include a nickel-free anodized layer 820 (e.g., the second anodized layer). The nickel-free anodized layer 820 may be formed on the surface of the aluminum metal 810 according to the secondary anodizing process 309 of FIG. 3.

In an embodiment, after the primary anodizing operation, a separate elution process (e.g., the nickel elution process 305) for removing the nickel component present on the metal surface of the first area 200 may be additionally performed. The elution process is performed at a high temperature (e.g., 100° C.), and since heat is applied on the metal surface, not only the nickel component but also molecules involved in implementing adhesiveness (e.g., a molecular force) may be removed. When the surface of the first area is subjected to this process more times, the surface energy may be caused to decrease. Since the processes from a process after the primary anodizing to the pore sealing treatment have been completed on the first area 200, the secondary anodizing process 309 for the first area 200 does not affect the appearance of the terminal. In addition, the portion to which the secondary anodizing process 309 is applied corresponds to the inside of the terminal that is not visible from the outside. Therefore, in the secondary anodizing process 309, the use of a coloring process, a nickel-containing pore sealing liquid, or the like is not essential.

In an embodiment, after the secondary anodizing, the surface energy of the second area 210 formed without the elution process may be greater than the surface energy of the first area 200. The surface energy may refer, for example, to energy generated by an imbalance of intermolecular interaction forces occurring at a contact interface between two different materials (e.g., metal and water). When the surface energy is high, adhesiveness is improved. However, since it is difficult to directly measure the surface energy, the surface energy may be calculated by measuring a water contact angle. The water contact angle may refer, for example, to an angle between a water droplet in a stationary state and a solid surface (e.g., an aluminum metal) after the droplet is dropped on the solid surface. When the water contact angle decreases, it may refer, for example, to the bonding force between the solid surface and water increasing and may refer, for example, to the adhesiveness of the solid surface increasing. In an embodiment, the water contact angle 840 with respect to the second area 210 of the metal frame 118 may be smaller than the water contact angle 830 with respect to the first area 200. For example, when the water contact angle 830 with respect to the first area 200 is about 29.4°, the impact load on the first area 200 may correspond to about 274.4 Mj. When the water contact angle 840 with respect to the second area 210 is about 12.6°, the impact load on the second area 210 may correspond to about 367.5 Mj. This may refer, for example, to the adhesiveness of the second area 210 being greater than the adhesiveness of the first area 200 since, when the impact load increases, the adhesiveness increases.

An electronic device according to an example embodiment may include: a cover glass disposed on a front surface of the electronic device, and a housing on which the cover glass is seated. The housing may include a metal frame comprising a metal material and the metal frame may be provided with a seating surface configured to seat the cover glass. The metal frame of the housing may include a first area forming at least a portion of a side surface of the electronic device and a second area to which the cover glass is attached, a nickel (Ni)-containing anodized layer is disposed in the first area of the metal frame, and a nickel-free anodized layer may be disposed in the second area of the metal frame.

In the electronic device according to an example embodiment, an adhesive layer may be disposed between the nickel-free anodized layer of the second area and the cover glass. The adhesive layer may include a liquid adhesive.

In the electronic device according to an example embodiment, the second area in which the nickel-free anodized layer is disposed may have a surface energy greater than a surface energy of the first area in which the nickel-containing anodized layer is disposed.

In the electronic device according to an example embodiment, the second area in which the nickel-free anodized layer is disposed may have a surface strength less than a surface strength of the first area in which the nickel-containing anodized layer is disposed.

In the electronic device according to an example embodiment, the metal frame may further include a support providing another area distinct from the first area and the second area, and a display module including a display may be disposed in an inner space defined between the cover glass and the support member.

In the electronic device according to an example embodiment, the metal frame may include a side area interconnecting the first area and the second area and forming a vertical step between the first area and the second area.

In the electronic device according to an example embodiment, the nickel-free anodized layer may be disposed on the side area of the metal frame, and the cover glass may be bonded to the second area and the side area of the metal frame. In addition, a height of the side area may correspond to a sum of a thickness of the edge area of the cover glass and a thickness of the adhesive layer.

In the electronic device according to an example embodiment, a width of the second area of the metal frame may have a thickness in a range of 1 mm to 1.5 mm.

The electronic device according to an example embodiment may further include a display panel disposed under the cover glass, wherein the display panel may be disposed in an accommodation space provided in the housing.

In the electronic device according to an example embodiment, the metal frame may further include a third area forming a rear surface of the electronic device.

The electronic device according to an example embodiment may further include a rear cover forming the rear surface of the electronic device, wherein the rear cover may be disposed to cover a surface of an opening provided along the side surface of the housing and faces the cover glass.

Figure 9:
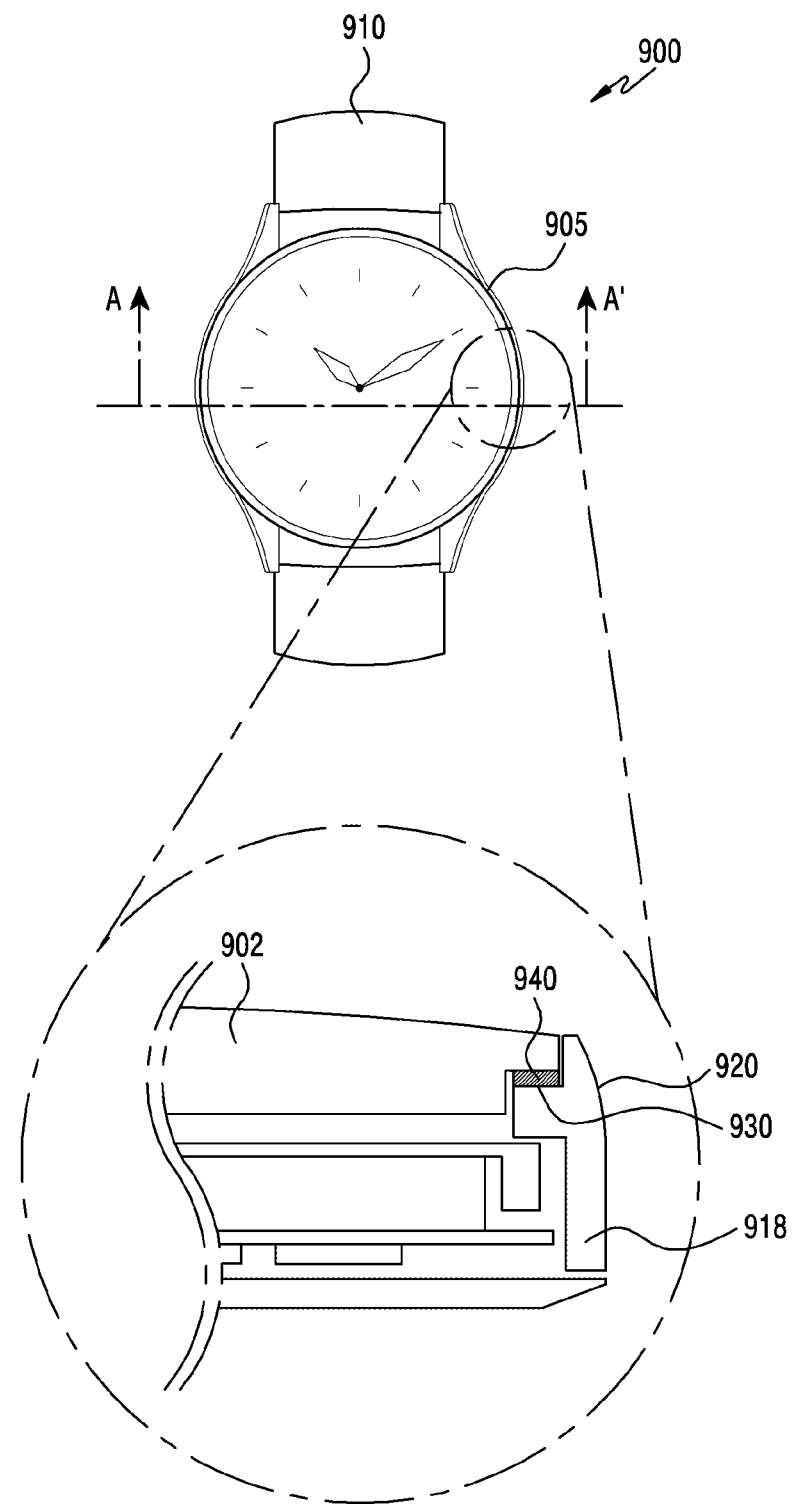
FIG. 9 a diagram illustrating an example wearable electronic device and a partial area of a cross-sectional view of the wearable electronic device taken along line A-A' according to various embodiments.

FIG. 9 is a diagram illustrating an example wearable electronic device and a partial area of a cross-sectional view of the wearable electronic device taken along line A-A' according to various embodiments. Since at least some of the components of the wearable electronic device 900 of FIG. 9 may correspond to the components of the electronic device 100 of FIG. 1A, a description that corresponds to a foregoing description or a description that is the same as or similar to a foregoing description may not be repeated.

Referring to FIG. 9, the wearable electronic device 900 may include a housing 905, a cover glass 902, a wearing member (e.g., a strap) 910, and a metal frame 918. In an embodiment, the wearing member 910 may be connected to at least a portion of the housing 905 (e.g., a portion of the metal frame 918), and may detachably bind the wearable electronic device 900 on a part of the user's body (e.g., a wrist or an ankle).

In an embodiment, the metal frame 918 may include a first area 920 forming at least a portion of the side periphery of the wearable electronic device 900 and a second area 930 to which the cover glass 902 is attached. In an embodiment, the first area 920 of the metal frame 918 may be exposed to the outer surface of the wearable electronic device 900, and the second area 930 may be disposed inside the wearable electronic device 900.

In an embodiment, a nickel-containing anodized layer may be formed in the first area 920 of the metal frame 918 according to process 303 of FIG. 3, and a nickel-free anodized layer may be formed in the second area 930 according to process 307 process of FIG. 3. In an embodiment, the first area 920 may be improved in corrosion resistance and durability since the nickel-containing anodized layer is disposed, and the second area 930 may be improved in adhesiveness to an adhesive member since the nickel-free anodized layer is disposed.

In an embodiment, an adhesive layer 940 may be disposed between the second area 930 of the metal frame 918 and at least one area of the cover glass 902. For example, as a liquid adhesive member is applied on the second area 930, the adhesive layer 940 may be formed, and the second area 930 of the metal frame 918 and at least one area of the cover glass 902 may be bonded to each other via the formed adhesive layer 940.

A wearable electronic device according to an example embodiment may include: a wearing member (e.g., a strap) configured to be worn on a part of a body; and a housing including a coupling structure to which the wearable member is coupled, wherein the housing further includes a metal frame including a first area forming a side surface of the wearable electronic device and a second area extending from the first area to inside of the wearable electronic device; and a cover glass defining a front surface of the wearable electronic device and seated on the second area of the metal frame. In addition, a nickel (Ni)-containing anodized layer may be disposed in the first area of the metal frame, and a nickel-free anodized layer may be disposed in the second area of the metal frame.

In the wearable electronic device according to an example embodiment, an adhesive layer may be disposed between the nickel-free anodized layer of the second area and the cover glass. The adhesive layer may comprise a liquid adhesive.

In the wearable electronic device according to an example embodiment, the second area in which the nickel-free anodized layer is disposed may have a surface strength less than a surface strength of the first area in which the nickel-containing anodized layer is disposed.

In the wearable electronic device according to an example embodiment, the housing may further include a support providing another area distinct from the first area and the second area, and a display module including a display panel may be disposed in an inner space between the cover glass and the support.

In the wearable electronic device according to an example embodiment, the metal frame may include a side area interconnecting the first area and the second area and forming a vertical step between the first area and the second area.

In the wearable electronic device according to an example embodiment, the nickel-free anodized layer may be disposed on the side area of the metal frame, and the cover glass may be bonded to the second area and the side area of the metal frame.

Figure 10:
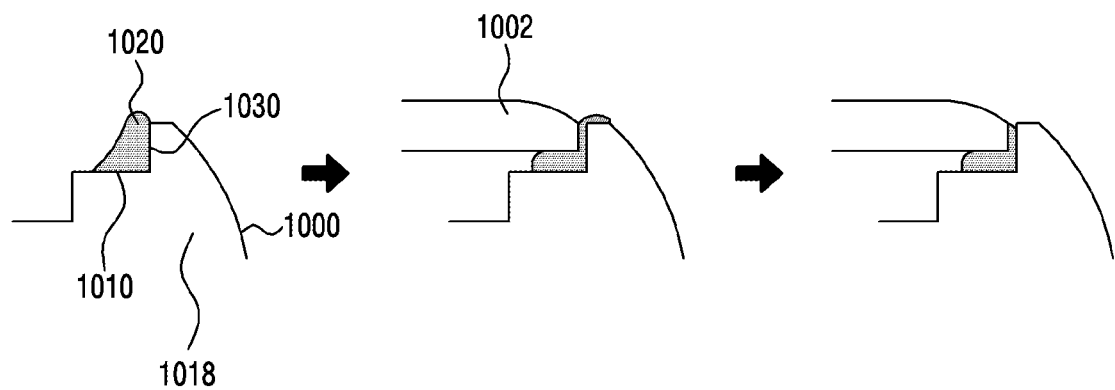
FIG. 10 is a diagram illustrating an example process in which a metal frame and a cover glass are coupled to each other through a side bonding method according to various embodiments.

FIG. 10 is a diagram illustrating an example process in which a metal frame and a cover glass are coupled to each other through a side bonding method according to various embodiments.

Referring to FIG. 10, a metal frame 1018 of an electronic device (e.g., the electronic device 100 in FIG. 1A and/or the wearable electronic device 900 in FIG. 9) may include a first area 1000 forming at least a portion of the side surface of the electronic device, a second area 1010 to which a cover glass is bonded, and a side area 1030 forming a vertical step between the first area 1000 and the second area 1010. In an embodiment, the side area 1030 may be included in the bonding area generated through process 305 of FIG. 3. For example, the bonding area of the metal frame 1018 generated through the second CNC process may include the second area 1010 and the side area 1030, and the second area 1010 and the side area 1030 may be subjected to secondary anodizing treatment through process 307 of FIG. 3. In an embodiment, the second area 1010 and the side area 1030 may be improved in adhesiveness by being provided with a nickel-free anodized layer.

In an embodiment, an adhesive 1020 may be applied to the second area 1010 and the side area 1030 of the metal frame 1018. When the metal frame 1018 and the cover glass 1002 are bonded through a side bonding method, the adhesive 1020 applied to the second area 1010 and the side area 1030 may be applied in an increased amount compared to the adhesive applied in a lamination bonding method (e.g., a method of applying the adhesive only to at least a portion of the second area).

In an embodiment, when the cover glass 1002 is bonded to the adhesive 1020 that is applied in an increased amount, the adhesive 1020 may partially overflow to the first area 1000 of the metal frame 1018. In an embodiment, the first area 1000 may be subjected to anodizing treatment distinct from the anodizing treatment (e.g., the secondary anodizing treatment in step 307 of FIG. 3) for the second area 1010 and the side area 1030. For example, in the first area 1000 subjected to the anodizing treatment distinct from the secondary anodizing treatment, the adhesive 1020, which has overflowed, may be easily removed by a dedicated cleaning apparatus. In an embodiment, the height of the side area 1030 may correspond to the sum of the thickness of the edge area of the cover glass 1002 and the thickness of the adhesive layer formed by the adhesive 1020.

Figure 11:
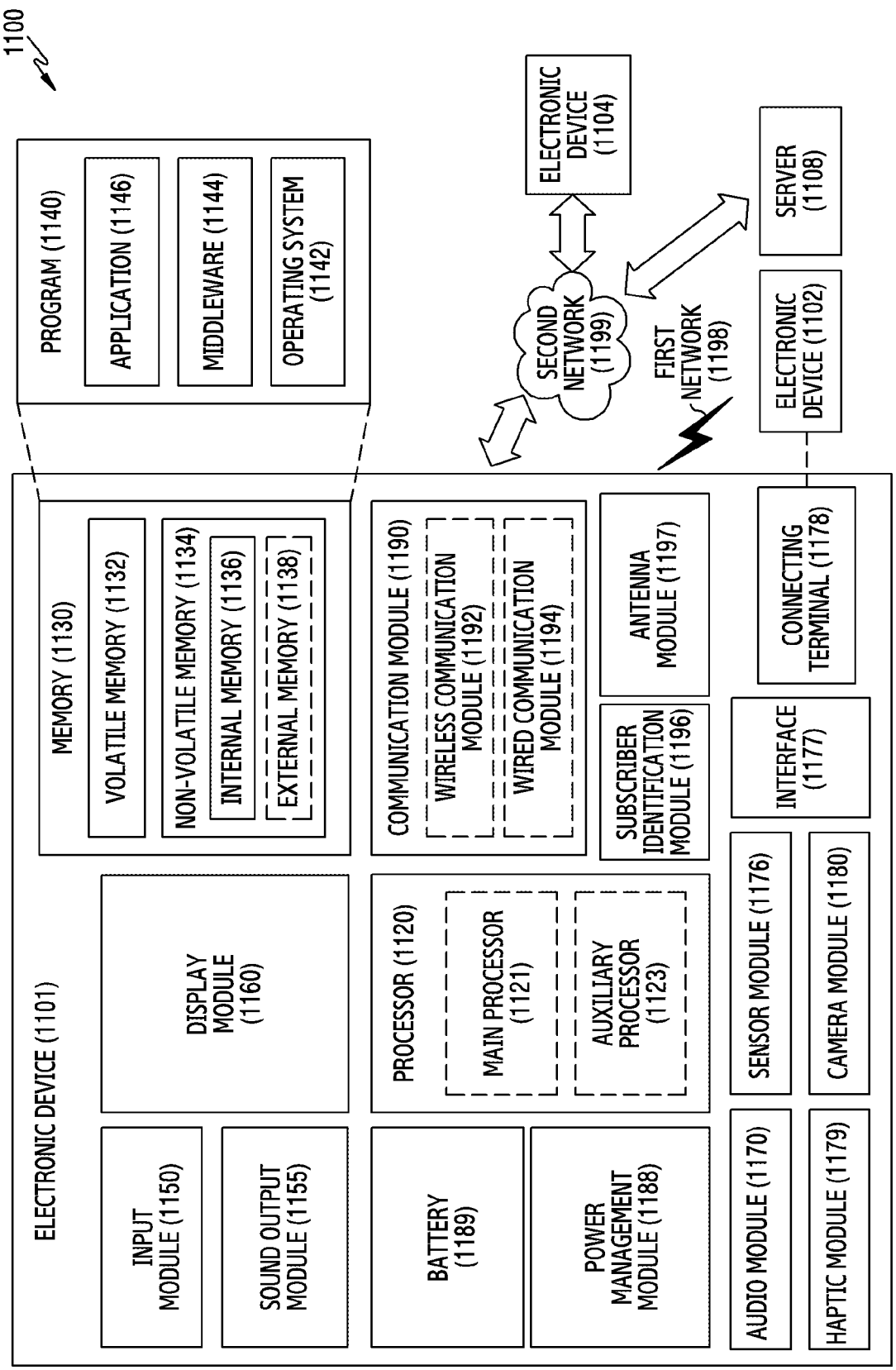
FIG. 11 is a block diagram illustrating an example electronic device in a network environment according to various embodiments.

FIG. 11 is a block diagram illustrating an example electronic device in a network environment according to various embodiments.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In various embodiments, at least one of the components (e.g., the connecting terminal 1178) may be omitted from the electronic device 1101, or one or more other components may be added in the electronic device 1101. In various embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to an embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to an embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element including a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In an embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a cover glass disposed on a front surface of the electronic device; and
    a housing on which the cover glass is seated, wherein the housing comprises a metal frame comprising a metal material and the metal frame includes a seating surface configured to seat the cover glass,
    wherein the metal frame of the housing comprises a first area forming at least a portion of a side surface of the electronic device and a second area to which the cover glass is attached, a nickel (Ni)-containing anodized layer is disposed in the first area of the metal frame, and a nickel-free anodized layer is disposed in the second area of the metal frame.

2. The electronic device of claim 1, wherein an adhesive layer is disposed between the nickel-free anodized layer of the second area and the cover glass.

3. The electronic device of claim 2, wherein the adhesive layer comprises a liquid adhesive.

4. The electronic device of claim 1, wherein the second area in which the nickel-free anodized layer is disposed has a surface energy greater than a surface energy of the first area in which the nickel-containing anodized layer is disposed.

5. The electronic device of claim 1, wherein the second area in which the nickel-free anodized layer is disposed has a surface strength less than a surface strength of the first area in which the nickel-containing anodized layer is disposed.

6. The electronic device of claim 1, wherein the metal frame further comprises a support including another area distinct from the first area and the second area, and a display module comprising a display panel is disposed in an inner space between the cover glass and the support.

7. The electronic device of claim 1, wherein the metal frame comprises a side area interconnecting the first area and the second area and including a vertical step between the first area and the second area.

8. The electronic device of claim 7, wherein the nickel-free anodized layer is disposed on the side area of the metal frame, and the cover glass is bonded to the second area and the side area of the metal frame.

9. The electronic device of claim 7, wherein a height of the side area is at least equal to sum of a thickness of an edge area of the cover glass and a thickness of an adhesive layer.

10. The electronic device of claim 1, wherein a width of the second area of the metal frame has a thickness between 1 mm and 1.5 mm.

11. The electronic device of claim 1, further comprising a display panel disposed under the cover glass,
    wherein the display panel is disposed in a space provided in the housing.

12. The electronic device of claim 1, wherein the metal frame further comprises a third area forming a rear surface of the electronic device.

13. The electronic device of claim 1, further comprising a rear cover forming a rear surface of the electronic device, and
    wherein the rear cover is disposed to cover a surface of an opening formed along the side surface of the housing facing the cover glass.

14. A wearable electronic device comprising:
    a housing comprising a metal frame comprising a first area forming a side surface of the wearable electronic device and a second area extending from the first area to inside of the wearable electronic device; and
    a cover glass defining a front surface of the wearable electronic device and seated on the second area of the metal frame,
    wherein a nickel (Ni)-containing anodized layer is disposed in the first area of the metal frame, and
    a nickel-free anodized layer is disposed in the second area of the metal frame.

15. The wearable electronic device of claim 14, wherein an adhesive layer is disposed between the nickel-free anodized layer of the second area and the cover glass.

16. The electronic device of claim 15, wherein the adhesive layer comprises a liquid adhesive.

17. The wearable electronic device of claim 14, wherein the second area in which the nickel-free anodized layer is disposed has a surface strength less than a surface strength of the first area in which the nickel-containing anodized layer is disposed.

18. The wearable electronic device of claim 14, wherein the housing further comprises a support including another area distinct from the first area and the second area, and
    a display module comprising a display panel is disposed in an inner space between the cover glass and the support.

19. The wearable electronic device of claim 14, wherein the metal frame comprises a side area interconnecting the first area and the second area and including a vertical step between the first area and the second area.

20. The electronic device of claim 19, wherein an anodizing layer not containing nickel is disposed on the side area of the metal frame, and wherein the cover glass is attached to the second area and the side area of the metal frame.

* * * * *